(12) United States Patent
Kim et al.

(10) Patent No.: US 8,865,503 B2
(45) Date of Patent: Oct. 21, 2014

(54) BACK CONTACTING SOLAR CELL HAVING P-DOPED REGIONS AND N-DOPED REGIONS AT THE SAME LAYER AND MANUFACTURING METHOD THEREOF

(75) Inventors: Won-Gyun Kim, Yongin-si (KR); Hee-June Kwak, Yongin-si (KR); Sang-Jin Park, Yongin-si (KR); Sang-Won Seo, Yongin-si (KR); Young-Jin Kim, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 281 days.

(21) Appl. No.: 13/413,629

(22) Filed: Mar. 6, 2012

(65) Prior Publication Data
US 2012/0273040 A1   Nov. 1, 2012

(30) Foreign Application Priority Data
Apr. 29, 2011   (KR) .......................... 10-2011-0041124

(51) Int. Cl.
*H01L 31/04* (2014.01)
*H01L 31/068* (2012.01)

(52) U.S. Cl.
CPC ........... *H01L 31/0682* (2013.01); *Y02E 10/547* (2013.01)
USPC ...................... 438/57; 257/E31.061; 136/256

(58) Field of Classification Search
CPC .................... H01L 31/022441; H01L 31/0682
USPC .................................................. 257/E31.061
See application file for complete search history.

(56) References Cited

U.S. PATENT DOCUMENTS

| 4,478,879 | A | * | 10/1984 | Baraona et al. | 438/57 |
| 5,641,362 | A | * | 6/1997 | Meier | 136/256 |
| 5,973,260 | A | * | 10/1999 | Tange et al. | 136/256 |
| 6,998,288 | B1 | | 2/2006 | Smith et al. | |

(Continued)

FOREIGN PATENT DOCUMENTS

| JP | 2008-517451 A | 5/2008 |
| JP | 2009-521805 A | 6/2009 |

(Continued)

OTHER PUBLICATIONS

Ashcroft, Neil W, Mermin, N. David, Solid state physics, 1976, Holt, Rinehart and Winston, ISBN 0-03-083993-9, pp. 92-93.*

(Continued)

*Primary Examiner* — William F Kraig
*Assistant Examiner* — Pavel Ivanov
(74) *Attorney, Agent, or Firm* — Christie, Parker & Hale, LLP

(57) ABSTRACT

A method for forming doped regions in a solar cell includes preparing a first and second surface of a substrate, forming a first doped region doped with a first dopant in a part of the first surface, forming a silicon oxide layer on the first surface, the silicon oxide layer including a first silicon oxide layer on the first doped region and having a first thickness, and a second silicon oxide layer on a portion of the first surface not doped by the first dopant and having a second thickness that is less than the first thickness, implanting a second dopant from outside the first surface into the first silicon oxide layer and the second silicon oxide layer, and forming a second doped region adjacent the first doped region by performing heat treatment on the first silicon oxide layer, the second silicon oxide layer, and the substrate.

22 Claims, 13 Drawing Sheets

(56) References Cited

U.S. PATENT DOCUMENTS

| | | | |
|---|---|---|---|
| 7,135,350 B1 * | 11/2006 | Smith et al. | 438/48 |
| 7,339,110 B1 | 3/2008 | Mulligan et al. | |
| 7,670,937 B2 * | 3/2010 | Veschetti et al. | 438/548 |
| 7,820,475 B2 | 10/2010 | De Ceuster et al. | |
| 2005/0172996 A1 * | 8/2005 | Hacke et al. | 136/256 |
| 2007/0169808 A1 * | 7/2007 | Kherani et al. | 136/258 |
| 2008/0035198 A1 | 2/2008 | Teppe et al. | |
| 2009/0017606 A1 | 1/2009 | Fath et al. | |
| 2009/0308438 A1 * | 12/2009 | De Ceuster et al. | 136/255 |
| 2011/0070681 A1 * | 3/2011 | Nakayashiki et al. | 438/87 |
| 2011/0217810 A1 * | 9/2011 | Bateman et al. | 438/96 |
| 2011/0298100 A1 * | 12/2011 | Nakamura | 257/655 |

FOREIGN PATENT DOCUMENTS

| | | |
|---|---|---|
| KR | 10-0590258 | 4/2004 |
| KR | 10-2006-0066280 A | 6/2006 |
| KR | 10-2007-0092953 A | 9/2007 |
| KR | 10-0766254 B1 | 10/2007 |
| KR | 10-0877821 B1 | 11/2007 |
| KR | 10-2008-0091102 A | 10/2008 |
| KR | 10-2008-0097413 A | 11/2008 |
| KR | 10-0965600 B1 | 10/2009 |
| KR | 10-2011-0010336 A | 10/2010 |
| KR | 10-2011-0010336 A | 2/2011 |

OTHER PUBLICATIONS

R. Woehl, J. Krause, F. Granek, and D. Biro, 19.7% Efficient All-Screen-Printed Back-Contact Back-Junction Silicon Solar Cell With Aluminum-Alloyed Emitter, Mar. 2011, IEEE, IEEE Electron Device Letters, Vol. 32, No. 3, March 2011, p. 345-347.*

Korean Patent Abstract No. 10-2004-0032004 for KR No. 10-0590258, 2 pgs, Oct. 2004.

Korean Patent Abstract No. 10-2007-0043157 for KR No. 10-0766254, 2 pgs Oct. 2007.

Korean Patent Abstract No. 10-2007-0106818 for KR No. 10-0877821, 2 pgs Oct. 2007.

Korean Patent Abstract No. 10-2009-01007326 for KR No. 10-0965600, 2 pgs. Oct. 2009.

* cited by examiner

BACK CONTACTING SOLAR CELL HAVING P-DOPED REGIONS AND N-DOPED REGIONS AT THE SAME LAYER AND MANUFACTURING METHOD THEREOF

CROSS-REFERENCE TO RELATED APPLICATION

This application claims priority to and the benefit of Korean Patent Application No. 10-2011-0041124 filed in the Korean Intellectual Property Office on Apr. 29, 2011, the entire content of which is incorporated herein by reference.

BACKGROUND

1. Field

The described technology relates generally to a solar cell and a method manufacturing the same.

2. Description of Related Art

A solar cell includes a silicon substrate, a region of which has a surface that is p-doped, and a region of which has a surface that is n-doped. When solar light is incident on the solar cell, that is, when photons enter into the substrate, electron-hole pairs are formed in the substrate, the generated electrons move to the n-doped region, and the generated holes move to the p-doped region. Due to the movement of the electrons and the holes, a photovoltaic effect is generated, and a potential difference occurs between ends of the p-n junction. In addition, free electrons and holes respectively move to the n-doped region and the p-doped region such that a current is generated. Power is generated from the potential difference, and the current is supplied to a load circuit coupled to the solar cell. Accordingly, solar cell energy is converted to useable electric energy.

A back contact solar cell includes a substrate, a reflection preventing layer, doped regions, a protection layer, and contact electrodes. The substrate is a wafer or a plate of single crystal silicon or poly crystal silicon, and functions as a passage for movement of electrons and holes. The front surface of the substrate is textured, and the reflection preventing layer formed of silicon nitride and/or silicon oxide is formed on the front surface of the substrate. At the back surface facing the front surface, n-doped regions and p-doped regions are alternately arranged. The protection layer is coated on the back surface. The protection layer is partially eliminated so that via holes are formed. The contact electrodes are electrically coupled with the doped regions through the via holes.

The doped regions and the reflection preventing layers of the solar cell are manufactured in sequence by a process for forming the p-doped regions, a process for forming the textured front surface, a process for forming the reflection preventing layer, and a process for forming the n-doped regions. The processes for forming the doped regions include processes for deposition of silicon dioxide layers and processes during which the silicon dioxide layers are selectively etched. The process during which the silicon dioxide layer is deposited is a detailed process during which a doped dioxide silicon including an n-type or p-type material and an undoped silicon dioxide layer are layered using an atmospheric pressure chemical vapor deposition (APCVD) method. The process for selectively etching the silicon dioxide layers includes detailed processes for selectively etching a part of the silicon dioxide layers using etch resist coated on the silicon dioxide layer.

The above-stated manufacturing method of the solar cell may complicate the processes due to increased number of processes for forming the doped regions and increased cost of manufacturing. Thus, simplification of the manufacturing process and manufacturing cost reduction may be desired.

In the solar cell manufactured using the above-stated method, p-doped regions and neighboring n-doped regions have different polarities and contact each other. Thus, electron-hole pairs generated by photons from the contact areas can be easily recombined so that use efficiency of solar energy of the solar cell may be deteriorated. Accordingly, neighboring regions respectively doped with different polarities in the solar cell should be separated.

The above information disclosed in this Background section is only for enhancement of understanding of the background of the described technology and therefore it may contain information that does not form the prior art that is already known in this country to a person of ordinary skill in the art.

SUMMARY

The described technology has been made in an effort to provide a solar cell having a simplified manufacturing process and low manufacturing cost, and a manufacturing method thereof.

In addition, embodiments of the present invention provide a solar cell having high solar light use efficiency and a manufacturing method thereof.

A method for forming a doped region in a solar cell according to embodiments of the present invention includes preparing a first surface of a substrate and a second surface of the substrate opposite the first surface, forming a first doped region doped with a first dopant in a part of the first surface, forming a silicon oxide layer on the first surface, the silicon oxide layer including a first silicon oxide layer on the first doped region and having a first thickness, and a second silicon oxide layer on a portion of the first surface undoped by the first dopant and having a second thickness that is less than the first thickness, implanting a second dopant from outside the first surface into the first silicon oxide layer and the second silicon oxide layer, and forming a second doped region adjacent the first doped region by performing heat treatment on the first silicon oxide layer, the second silicon oxide layer, and the substrate.

The forming of the first doped region may include implanting the first dopant into the first surface and activating the implanted first dopant.

The implanted first dopant may be activated concurrently with the forming of the silicon oxide layer.

The first thickness of the first silicon oxide layer may be larger than about 1800 Å.

The first thickness of the first silicon oxide layer may be larger than about 2000 Å.

The first doped region and the second doped region may be separated from each other.

The first doped region and the second doped region may be separated from each other by more than 100 μm.

The method may further include implanting the first dopant between the first doped region and the second doped region with a concentration of ions that is lower than that of the first doped region, and implanting the second dopant between the first doped region and the second doped region with a concentration that is lower than that of the second doped region.

The implanting of the first dopant between the first doped region and the second doped region may be performed concurrently with the implanting of the first dopant to the first doped region.

The implanting of the first dopant between the first doped region and the second doped region may be performed after the implantation of the first dopant to the first doped region.

A region between the first doped region and the second doped region may include a neutralized region, and a concentration of the first dopant in the neutralized region may be higher than that of the second dopant.

A region between the first doped region and the second doped region may include a neutralized region, and a concentration of the first dopant in the neutralized region may be lower than that of the second dopant.

The forming of the first doped region may include positioning a hard mask close to the first surface of the substrate, the hard mask having at least one ion transmission portion and an ion blocking portion between ion transmission portions of the at least one ion transmission portion, and implanting the first dopant to a portion of the first surface corresponding to the at least one ion transmission portion.

The at least one ion transmission portion may be in a shape of a closed polygon, and adjacent ion transmission portions of the at least one ion transmission portion may be separated.

The hard mask further may further include an ion semi-transmission portion contacting the at least one ion transmission portion.

The ion semi-transmission portion of the hard mask may be thinner than the ion blocking portion.

At least one micro opening having an area smaller than the at least one ion transmission portion may be formed in the ion semi-transmission portion.

The method may further include forming a neutralized region at a periphery of the first doped region, and the forming the neutralized region may include locating the hard mask close to the first surface, the hard mask having an ion blocking portion between an ion transmission portion for forming the neutralized region and an adjacent ion transmission portion for forming the neutralized region, and implanting the first dopant through the ion transmission portion and to the first surface, wherein the ion transmission portion may be larger than the first doped region and may be located corresponding to the position of the first doped region.

The forming of the neutralized region may occur after the forming of the first doped region.

The forming of the neutralized region may occur before the forming of the first doped region.

The first dopant of the first doped region may be an n-type material, and the second dopant of the second doped region may be a p-type material.

The method may further include performing heat treatment on the substrate after implantation of the first dopant in the substrate.

A solar cell according to another exemplary embodiment of the present invention converts light energy (e.g., photonic or solar energy) to electrical energy. The solar cell includes a substrate having a first surface and a second surface opposite the first surface, a first doped region in the first surface and doped with a first dopant, a second doped region adjacent the first doped region in the first surface and doped with a second dopant, a first silicon oxide layer on the first doped region, and a second silicon oxide layer on the second doped region, wherein the first silicon oxide layer is thicker than the second silicon oxide layer.

A thickness of the first silicon oxide layer may be greater than 1800 Å.

The thickness of the first silicon oxide layer may be greater than 2000 Å.

The first dopant of the first doped region may be in the first and second silicon oxide layers.

The first doped region and the second doped region may be separated from each other.

The solar cell may further include a neutralized region between the first doped region and the second doped region, and the neutralized region may include the first dopant and the second dopant.

The solar cell may further include a third silicon oxide layer on the neutralized region and having a thickness that is less than that of the first silicon oxide layer and greater than that of the second silicon oxide layer.

Another exemplary embodiment of the present invention provides a manufacturing method of a solar cell having a first conductive-type region and a second conductive-type region that is opposite to the first conductive type on a first surface of a semiconductor substrate. The manufacturing method includes forming the first conductive-type region on the first surface, oxidizing the first surface to cause a first oxide layer on the first conductive-type region that is larger than a second oxide layer corresponding to an area on the first surface excluding the first oxide layer, and forming the second conductive-type region by implanting second conductive-type ions using the first oxide layer as a self-alignment mask.

Another exemplary embodiment of the present invention provides a solar cell including a first conductive-type region on a first surface of a semiconductor substrate and including a first conductive type, a first oxide layer on the first conductive-type region, a second conductive-type region adjacent the first conductive-type region on the first surface and including a second conductive type opposite the first conductive type, and a second oxide layer on the second conductive-type region and having a thickness that is less than that of the first oxide layer, wherein the first oxide layer is used as a mask during implantation of second conductive-type ions to form the second conductive-type region, and wherein the second oxide layer is used as a transmission layer for ion implantation.

When the solar cell is manufactured using a silicon oxide used as a self-alignment mask according to embodiments of the present invention, the manufacturing process can be simplified and manufacturing time and cost can be saved. Further, since regions doped with opposite polarity are separated from each other, efficiency of the solar cell can be improved.

DETAILED DESCRIPTION

Figure 1A:
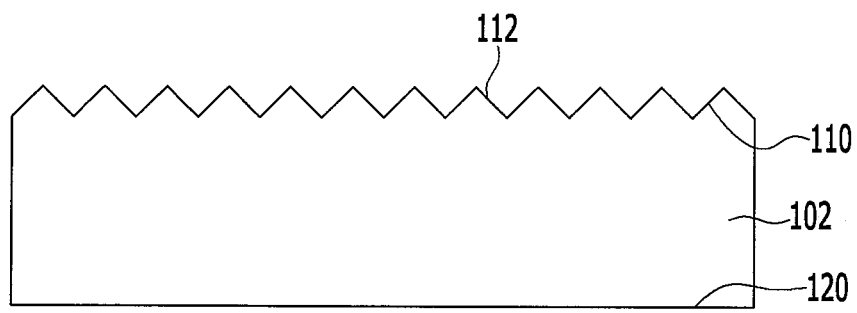
FIG. 1A to FIG. 1G are schematic cross-sectional views of processes for manufacturing a back contacting solar cell according to an exemplary embodiment.

A manufacturing method of a solar cell according to exemplary embodiments of the present invention will be described with reference to the accompanying drawings. Like reference numerals designate like parts and elements throughout the specification and the drawings. Further, various values are used in exemplary embodiments of the present invention, but the values do not limit the scope of the appended claims unless they are included within the spirit and scope of the appended claims.

FIG. 1A to FIG. 1G are schematic cross-sectional views of processes for manufacturing a back contacting solar cell according to an exemplary embodiment of the present invention. Layers formed in front and back surfaces of a substrate are formed through the respective processes. According to an aspect of embodiments of the present invention, a silicon oxide layer grown on a surface of doped regions in the back surface of the substrate is thicker than a silicon oxide layer grown on an undoped region. The relatively thick silicon oxide on the doped regions may be used as a self-alignment mask during a process for ion-implantation of dopants into undoped regions.

FIG. 1A is a schematic cross-sectional view of a silicon substrate used for manufacturing a solar cell according to the present exemplary embodiment. A silicon substrate 102 is a single crystal silicon wafer having a lattice structure of (110), which will be understood by one of ordinary skill in the art. The wafer is lightly doped with dopants of one material selected from n-type phosphorus (P), arsenic (As), antimony (Sb), and a mixture thereof. For example, the substrate may be doped with phosphorus atoms at a concentration of $1.\times10^{15}$ ions/cm$^2$. The substrate may be poly crystal silicon.

A front surface 110 of the substrate 102, to which solar light enters, is structured by being etched with a mixed solution of potassium hydroxide (KOH) and isopropyl alcohol or N-methyl-2-pyrrolidone (NMP) such that a front surface 112 is textured, giving the appearance of random pyramids. A back surface 120 of the substrate 102 has a polished and planarized surface, along with elimination of crystal flaw, a cut flaw, a natural oxide layer, or an unnecessary impurity thereof. The substrate 102 may have a thickness of about 150 μm to 170 μm.

Figure 1B:
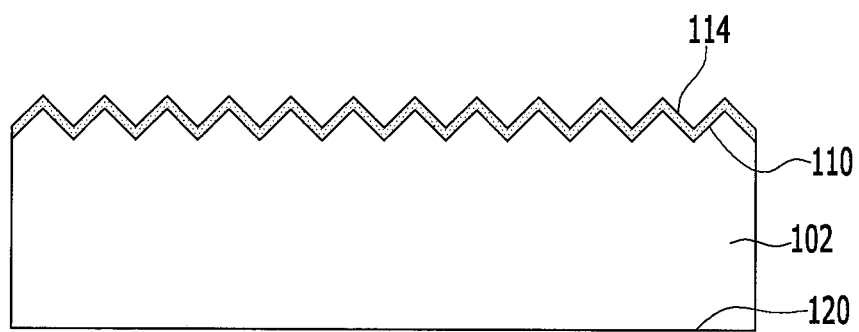

FIG. 1B is a schematic cross-sectional view of a front surface field layer 114 formed on the textured front surface 112. The front surface field layer 114 is formed on the textured front surface 112 of the substrate through a process for implantation of a low dose of phosphorus ions of about $1.0\times10^{13}$ ions/cm$^2$ to $7\times10^{15}$ ions/cm$^2$ to the textured front surface 112, and through a process for activation. The front surface field layer 114 reflects holes at the periphery thereof to the inside of the substrate 102 and to a direction of the back surface 120 to increase solar energy use efficiency of the solar cell.

Figure 1C:
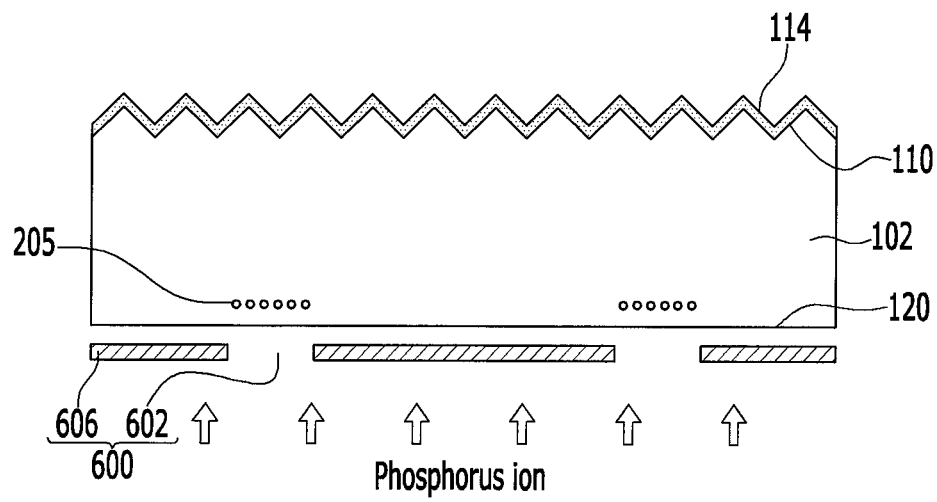

FIG. 1C is a schematic cross-sectional view of n-ion implanted regions 205 formed in the back surface 120 of the substrate 102. The n-ion implanted regions (e.g., base regions) 205, may be formed by performing an ion implantation process on a location (e.g., a predetermined location) of the substrate 102 with dopants of an n-type material. For example, in the phosphorus implantation process, phosphorus ions may be set to be implanted into silicon with a depth of about 800 nm in a room temperature chamber with electrical energy of 20 KeV and a dose of ions of about $1.5\times10^{15}$ ions/cm$^2$ to $4.5\times10^{15}$ ions/cm$^2$. During the ion implantation process, a hard mask 600 having an ion transmission portion 602 and an ion blocking portion 606 may be used. The hard mask 600 is a highly heat-resistive substrate formed of graphite or ceramic, and has a thickness of about 1 mm. The ion transmission portion 602 may be formed by laser beam processing.

The shape and the location of the hard mask 600 substantially corresponds to the n-ion implanted regions 205 of the substrate 102. The n-ion implanted regions 205 become n-doped regions 210 through a process to be described later, and therefore, the shape and the location of the ion transmission portions 602 of the hard mask 600 substantially correspond to the n-doped regions 210. For this, the hard mask 600 is located close to the back surface 120 of the substrate 102. For example, the hard mask 600 may be about 500 μm from the back surface 120 of the substrate 102. The ion implantation process according to the present exemplary embodiment is simpler and less expensive than a process during which layers of several silicon compounds are formed through a chemical vapor deposition method and the layers are partially etched.

According to the present exemplary embodiment, the front surface 110 of the substrate is textured and then the n-ion implantation regions 205 are formed in the back surface 120, but the present invention is not limited thereto. For example, the front surface process may be processed after the back surface process, as will be easily understood by a person skilled in the art.

Figure 2:
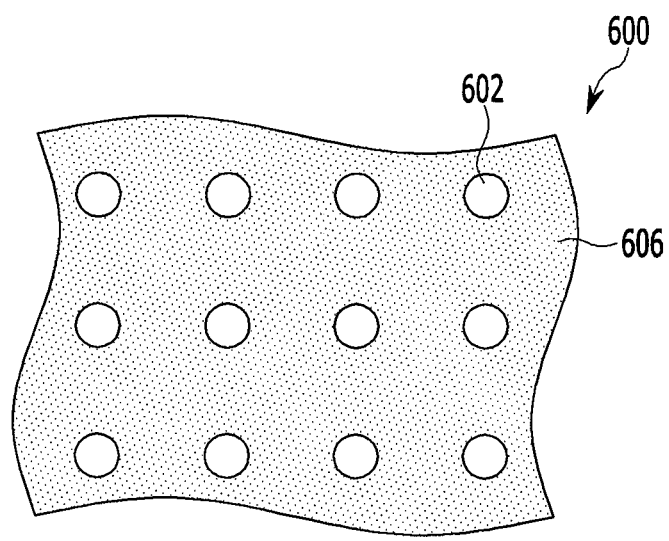
FIG. 2 is a schematic top plan view of a hard mask for ion implantation according to the exemplary embodiment of FIG. 1.

The n-ion implanted regions 205 may be a plurality of point ion implanted regions uniformly distributed through the entire area of the back surface 120 of the substrate 102. FIG. 2 illustrates a schematic top plan view of the hard mask 600 shown in FIG. 1C, and used in the process for forming the n-ion implanted regions 205 in the back surface 120 of the substrate 102 according to the present exemplary embodiment. The ion blocking portions 606 of the hard mask 600 may be located between ion transmission portions 602 of the hard mask 600. The ion transmission portions 602 may respectively have diameters of about 100 μm to 800 μm, and may be regularly arranged with a distance of about 1000 μm to 2000 μm from respective transmission portions 602 of the hard mask 600. As described above, the shape, size, and location of the ion transmission portion 602 are substantially the same as those of the n-doped regions 210 formed in the back surface 120 of the substrate 102.

The n-ion implanted regions 205 and the ion transmission portions 602 are respectively formed in the shape of a circle and distributed to the back surface 120 of the substrate and the hard mask 600, but the present invention is not limited thereto. The n-ion implanted regions 205 and the ion transmission portions 602 may respectively have different shapes such as, for example, an oval or a quadrangle, or may be formed in the shape of a line having a stem and a plurality of branches spreading from the stem.

Figure 1D:
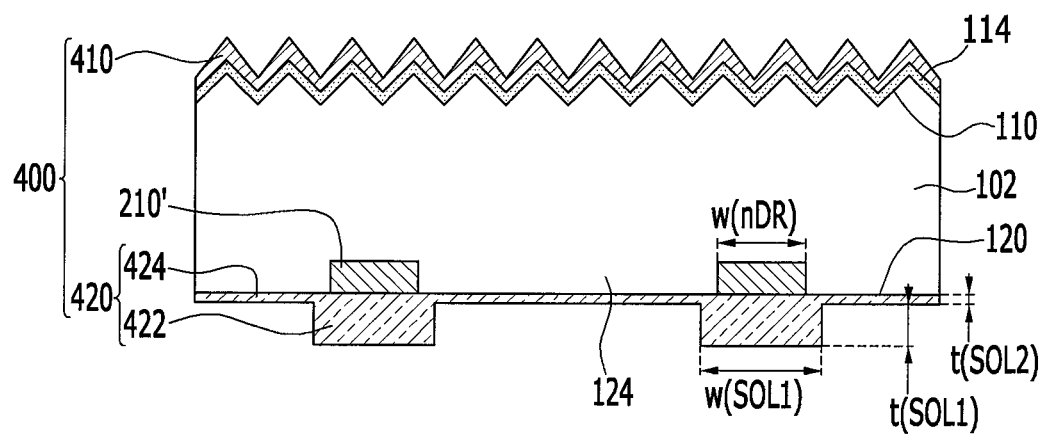

After the manufacturing process of FIG. 1C, implanted ions are activated and an oxide layer is formed (e.g., formed concurrently or simultaneously with the activation of the implanted ions) as shown in FIG. 1D. A silicon oxide layer(s) 400 may be silicon dioxide ($SiO_2$) formed through an oxidation process formed on portions of the front and back surfaces 110 and 120 of the substrate 102. The ion activation and oxidization process for forming or growing the silicon oxide layer(s) 400 may be formed with a flow ratio of oxygen gas and hydrogen gas in a volume ratio of about 6:9 for about 10 to 120 minutes at a temperature from about 800° C. to 1000° C. such that the ion implanted regions 205 become the doped regions 210.

One of the oxide layers 400 formed through the above process is a front surface silicon oxide layer 410 grown on the front surface field layer 114. The other one of the silicon oxide layers 400 is a back surface protection layer 420 grown on the back surface 120 of the substrate. A grown thickness of a first silicon oxide layer 422 formed on the n-ion implanted regions 210 among the back surface protection layer 420 may be proportional to concentration of the implanted ion. Accordingly, a thickness t(SOL1) of the first silicon oxide layer 422 on the n-doped regions 210, and formed through the activation and oxidization process of the n-ion implanted regions 205, may be larger than a thickness t(SOL2) of a second silicon oxide layer 424 on the undoped regions 124. In addition, since the silicon oxide layer 400 (e.g., the back surface protection layer 420) is formed in a direction parallel to the substrate 102, a width w(SOL1) of the first silicon oxide layer 422 is larger than a width w (DR) of the n-doped region 210.

Figure 3:
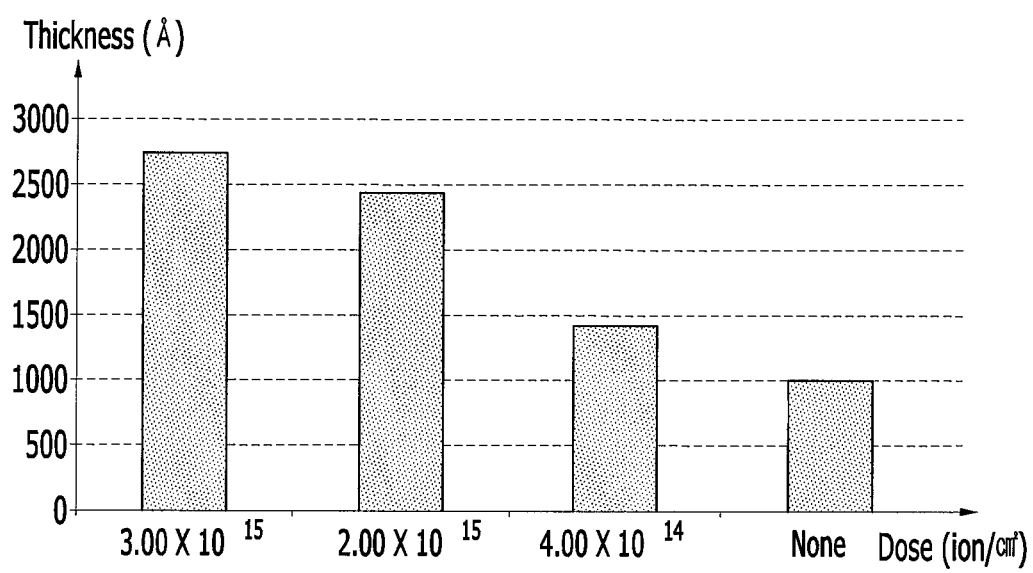
FIG. 3 is a graph showing a relation between doses implanted in a substrate and thicknesses of silicon oxide layers.

Referring to FIG. 3, shown are results of an experiment for oxidizing substrates having phosphorus-ion implanted regions with a value of an ion concentration of each dose and an energy of about 20 KeV, and having regions not implanted with ions, and being in a furnace or a chamber for 45 to 50 minutes at a temperature of about 900° C. with a flow ratio of the oxygen gas and the hydrogen gas having a volume ratio of about 3:2, the graph of FIG. 3 showing data corresponding to the oxidization. The graph shows that silicon oxide of about 1,000 Å is grown on the regions where ions are not implanted, and that thicker silicon oxide is grown on a region where a large amount of ions are implanted. For example, with a dose of $3.00 \times 10^{15}$ ions/cm$^2$, silicon oxide grown on the phosphorus-ion implanted region has a thickness over about 2,500 Å.

Figure 4:
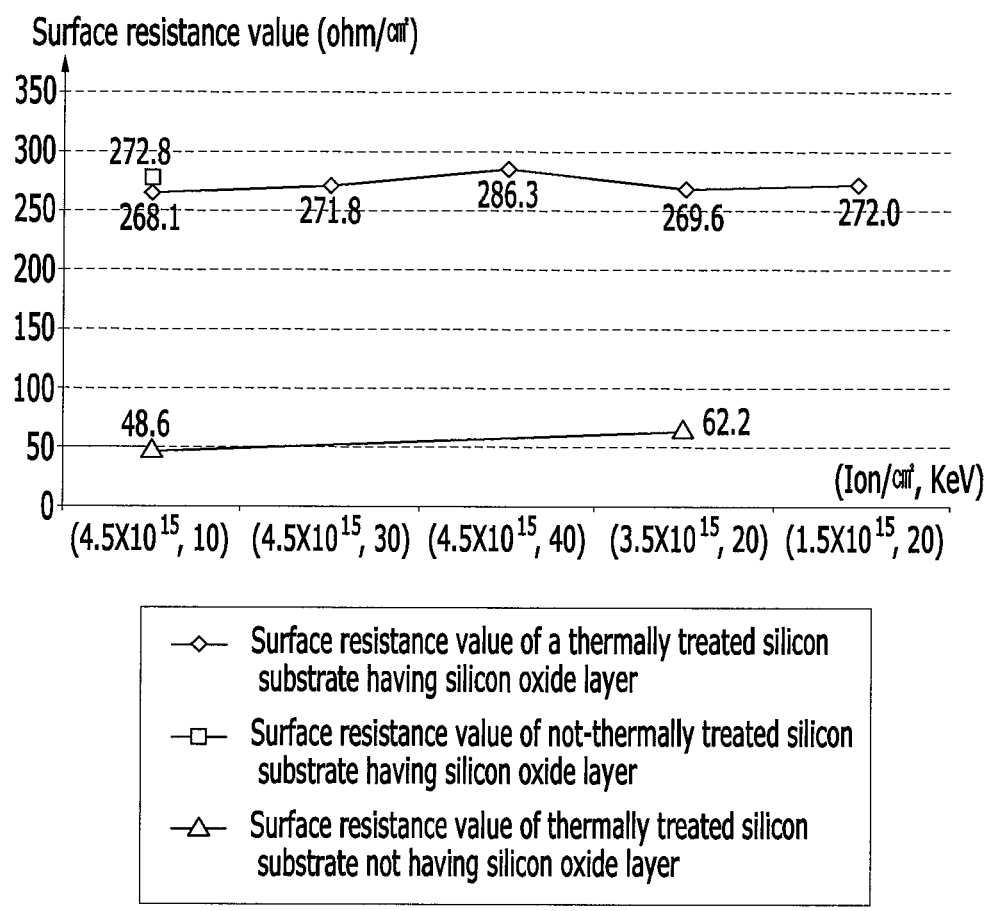
FIG. 4 is a graph showing results of an experiment performed to measure surface resistance of silicon substrates where silicon oxide layers, each having a thickness of about 2,500 Å, are formed.

Referring to FIG. 4, shown are the results of an experiment for measuring surface resistance of a silicon substrate having silicon oxide with a thickness of about 2,500 Å implanted with boron ions and sufficiently heat-treated. The boron ion implantation process was performed with a dose concentration of about $1.5 \times 10^{15}$ ions/cm$^2$ to $4.5 \times 10^{15}$ ions/cm$^2$ and energy of about 20 KeV to 40 KeV, and the heat treatment process was performed for about 60 minutes at about 1050° C. Then, the silicon oxide was eliminated in a mixed solution of hydrogen fluoride (HF) and deionized water having a ratio of 1:10, and the surface resistance of the silicon substrate was measured. As shown in FIG. 4, surface resistance values of the silicon substrate implanted with boron ions and not having silicon oxide grown are significantly smaller than surface resistance values of the silicon substrate implanted with the boron ions and having silicon oxide grown with a thickness of 2,500 Å. Therefore when the silicon oxide having a thickness of about 2,500 Å is implanted with the boron ions with a dose concentration of about $1.5 \times 10^{15}$ ions/cm$^2$ to $4.5 \times 10^{15}$ ions/cm$^2$ and with an energy of about 20 KeV to 40 KeV, the silicon oxide may be used as a mask.

Figure 1E:
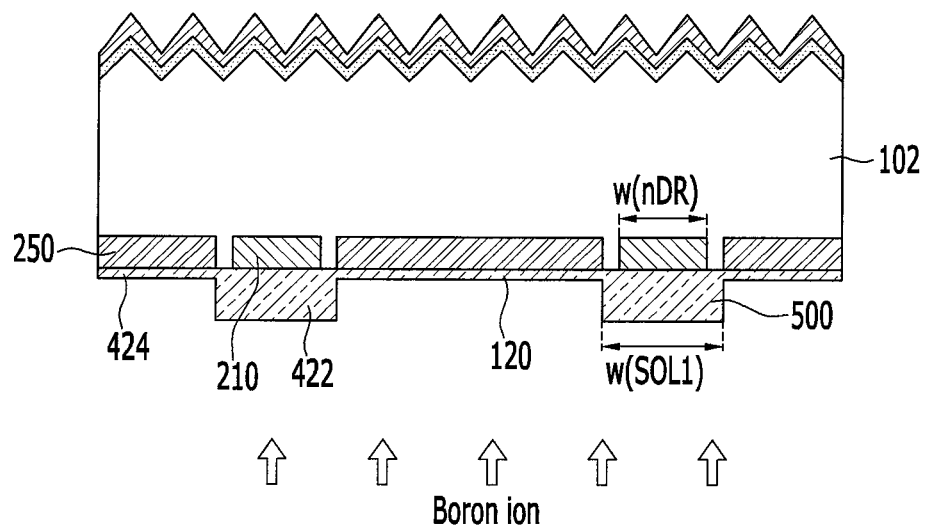

After the activation and oxidization processes of heat treating the n-ion implanted regions 205 described with respect to FIG. 1D, p-ion implantation is performed as shown in FIG. 1E. In the back surface 120 of the silicon substrate 102 of FIG. 1D, ions formed of a p-type material such as boron are implanted, and the implanted ions are activated through heat treatment of the silicon substrate 102 such that p-doped regions 250 are formed. When the boron ions are implanted in the silicon substrate 102, a relatively thick first silicon oxide layer 422 is used as a self-alignment mask 500 that prevents implantation of the boron ions into the silicon substrate 102, as previously described. On the other hand, a second silicon oxide 424 is relatively thin, and therefore, the boron ions are implanted into the silicon substrate 102. Accordingly, the p-doped regions 250 doped with the boron ions are formed between the n-doped regions 210 of the silicon substrate 102.

Here, the width w(SOL1) of each of the first silicon oxide layers 422 is larger than a width w(nDR) of each of the n-doped regions 210, and therefore, the p-doped regions 250 of the back surface 120 of the silicon substrate 102 may be formed at a distance from the n-doped regions 210. For example, the distance between neighboring doped regions 210 and 250 may be several hundreds of Å.

Figure 5:
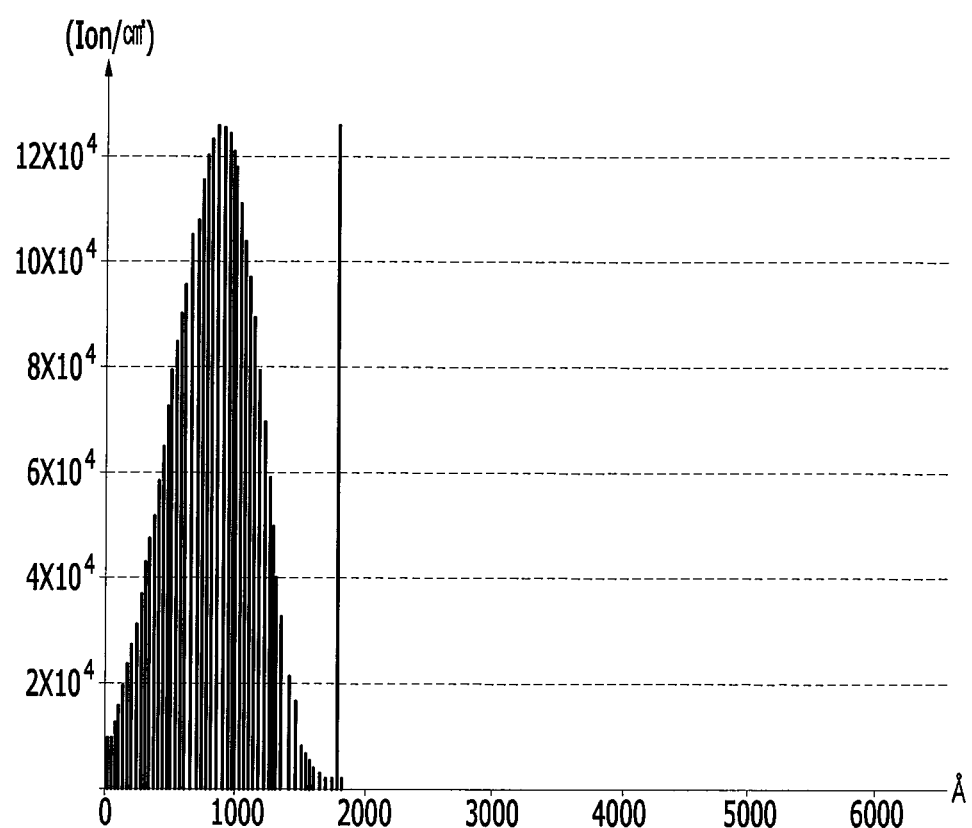
FIG. 5 shows a simulation of the concentration of boron ions as a function of the depth below the surface of the silicon oxide layer.

As described, in order to use the silicon oxide layer (e.g., the first silicon oxide layer) 422 on the n-doped region 210 as the self-alignment mask 500, a threshold thickness of the first silicon oxide layer 422 through which the boron ions cannot pass is used. FIG. 5 shows a simulation of the concentration of boron ions as a function of the depth below the surface of the silicon oxide layer. The simulation was performed to determine a relationship between the depth (e.g., the thickness) of the silicon oxide layer and the concentration of boron ions after the boron ions are implanted in the silicon oxide layer grown on the silicon layer and then activated, and the following Table 1 are conditions needed to be considered in the simulation.

TABLE 1

| Simulation program | TRIM (Transport of Ions in Matter) |
| --- | --- |
| Thickness of silicon layer | 500 nm |
| Thickness of silicon oxide layer | 180 nm |
| Implanted ion | boron ion |
| Ion implantation angle | 6 degrees (Direction reference vertical to surface of silicon oxide layer) |
| Implantation energy | 20 KeV |
| Average implanted distance | 804 Å |
| Standard deviation of average implanted distance | 307 Å |

According to the simulation results, the boron ions implanted in the silicon oxide layer are dispersed to a depth of about 1800 Å (180 nm) from the surface of the silicon oxide layer. Therefore, a silicon oxide layer thicker than about 1800 Å may be used. If the simulation has an error rate of about 10%, the silicon oxide layer used as the mask (e.g., through which the boron ions cannot pass) that is thicker than about 2000 Å (i.e., about 200 nm) may be used.

The n-doped regions 210 of the silicon substrate 102 of FIG. 1E may be formed in the shape of a plurality of closed polygons respectively separated with a constant distance as previously described with reference to FIG. 1C and FIG. 2. When a hard mask (e.g., the hard mask 600 of FIG. 2) is used to form the n-doped regions 210 instead of the self-alignment mask 500 (e.g., the thick silicon oxide layer 422) to form the p-doped regions 250 between the n-doped regions 210, a plurality of ion blocking portions (e.g., the ion blocking portions 606 of the hard mask 600 of FIG. 2) should be respectively arranged at a distance from each other to block implantation of the boron ions into the hard mask, which may otherwise make manufacturing of an effective hard mask very difficult or impossible.

Such a problem may be solved through processes of forming a silicon dioxide layer, forming a photo mask, etching, forming another silicon dioxide layer, and diffusion. However, such processes may increase manufacturing cost and time due to complexity of the manufacturing method of the solar cell. In contrast, the process during which the thick silicon oxide layer is used as the self-alignment mask may decrease manufacturing cost and time due to simplicity of the manufacturing method of the solar cell.

Figure 1F:
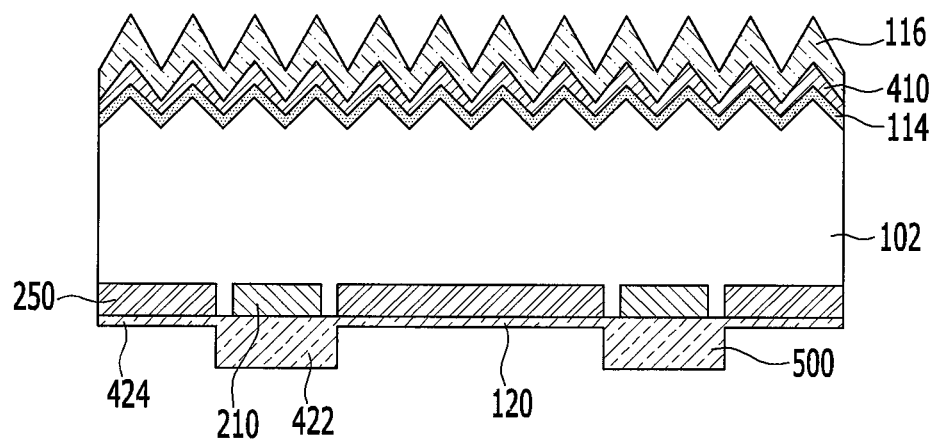

FIG. 1F is a schematic cross-sectional view of a reflection preventing layer 116 formed on the front surface silicon oxide layer 410. On the front surface silicon oxide layer 410 of the front surface 110 of the silicon substrate 102, the reflection preventing layer 116 such as, for example, silicon nitride is formed through a typical chemical vapor deposition method. The reflection preventing layer 116 prevents light that has entered the silicon substrate 102 from being discharged to the outside of the silicon substrate 102, together with the front surface silicon oxide layer 410 located under the reflection preventing layer 116 and the highly n-doped front surface field layer 114.

Figure 1G:
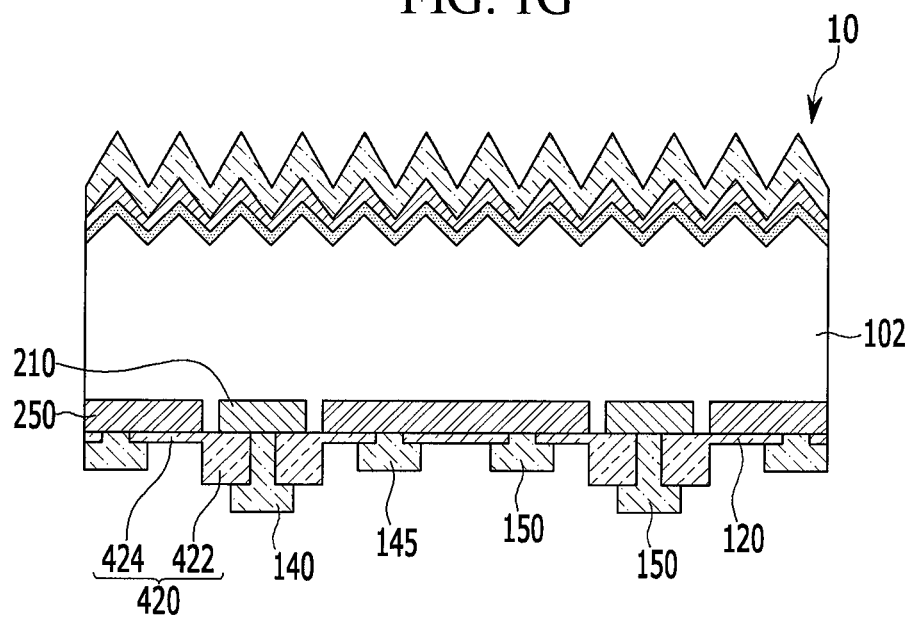

FIG. 1G is a schematic cross-sectional view of contact electrodes 140 and 145 formed through via holes 150 in the back surface 120 of the silicon substrate 102. Holes collected in the n-doped regions 210 and holes collected in p-doped regions 250 in the back surface 120 of the substrate 102 should be respectively coupled with an external load (not shown) through the contact electrodes 140 and 145. For this purpose, the via holes 150 are formed by etching the first and second silicon oxide layers 422 and 424 on the n-doped regions 210 and/or the p-doped regions 250 using a photolithography or screen-printing method. It is well understood by a person skilled in the art that the contact electrodes 140 and 145 formed of metal selected from cooper, titanium, tungsten, or an alloy thereof, may be located in the via holes 150.

According to another exemplary embodiment of the present invention, although it is not illustrated, undoped silicon glass is coated on the back surface silicon oxide layer 420, and then the protection layer and a part of the undoped silicon glass are eliminated such that the via holes 150 may be formed.

In the manufacturing method of the solar cell, described with reference to FIG. 1A to FIG. 1G, the n-doped regions 210 are first formed and the p-doped regions 250 are formed thereafter, but the solar cell may be manufactured through an opposite sequence according to another exemplary embodiment of the present invention. That is, the n-doped regions 210 may be formed by using the thick silicon oxide formed on the p-doped regions as a self-alignment mask in the process for forming the p-doped regions. Such a process will be understood by a person skilled in the art upon reviewing the detailed description of the exemplary embodiments of the present invention.

According to another exemplary embodiment of the present invention, using the silicon oxide layer formed with a large thickness on the doped region as the self-alignment mask may be applied not only to the manufacturing method of the back contact solar cell, but also to a manufacturing method of a solar cell having a structure in which an n-doped region and a p-doped region are adjacent to each other.

Figure 6A:
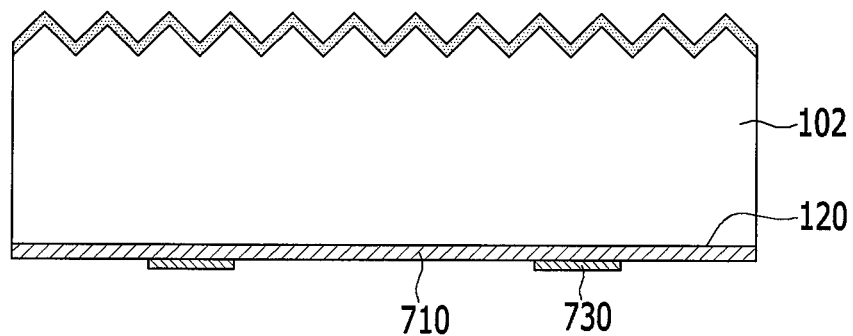
FIG. 6A to FIG. 6C are schematic cross-sectional views illustrating forming of an n-doped region according to another exemplary embodiment of the present invention.
Figure 6B:
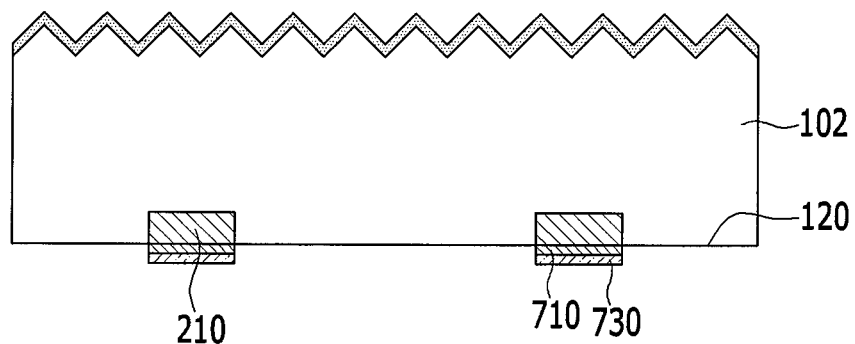
Figure 6C:
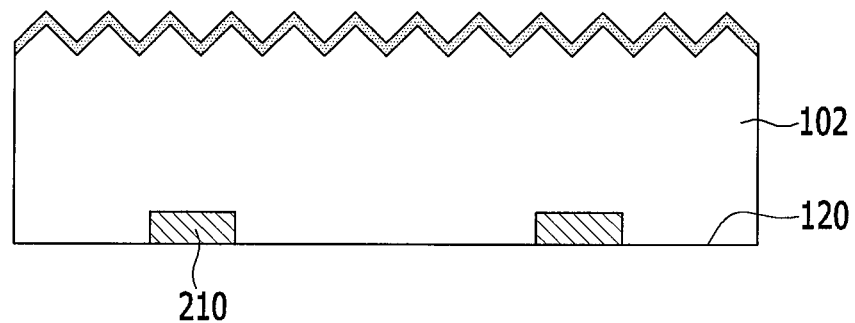

According to another exemplary embodiment of the present invention, a region formed first among the n-doped region and the p-doped region may be formed using a method different from the ion implantation process using the hard mask. FIG. 6A to FIG. 6C are schematic cross-sectional views of processes for forming the n-doped regions 210 using silicon glass layers. As shown in FIG. 6A, a doped silicon glass layer 710 and an etch resist layer 730 are sequentially coated on the back surface 120 of the silicon substrate 102. As shown in FIG. 6B, the doped silicon glass layer 710 of FIG. 6A is etched by using a mask of the etch resist layer 730, and the n-doped regions 210 are formed through the heat treatment process. FIG. 6C illustrates a process in which the doped silicon glass layer 710 and the etch resist layer 730 of FIG. 6B are eliminated, and the n-doped regions 210 are formed in the back surface 120 of the silicon substrate 102. After the above-stated processes, the processes for forming the p-doped regions described with reference to FIG. 1D to FIG. 1G (e.g., p-doped regions 250) may be applied.

According to a manufacturing method of the solar cell of the present exemplary embodiment, doped regions respectively having different polarities (e.g., n-doped regions and p-doped regions 210 and 250) are sufficiently separated in one surface of the silicon substrate (e.g., the back surface 120 of the silicon substrate 102) and a hard mask including a semi-transmissive portion (e.g., the ion semi-transmissive portions 604 of the hard mask 600) may be used. FIG. 7A to FIG. 7D are partial top plan views of the hard mask 600 used in the process for forming the n-doped region 210 in the surface 126 of the silicon substrate 102 and cross-sectional views of the process for forming the n-doped regions 210 and p-doped 250 regions separated from the n-doped regions 210 using the hard mask 600. As shown in FIG. 1C, the hard mask 600 is located close to one surface (e.g., surface 126 of FIG. 7B or the back surface 120 of FIG. 1C) of the silicon substrate 102 and transmits ions of n-type material such as phosphorus.

Figure 7A:
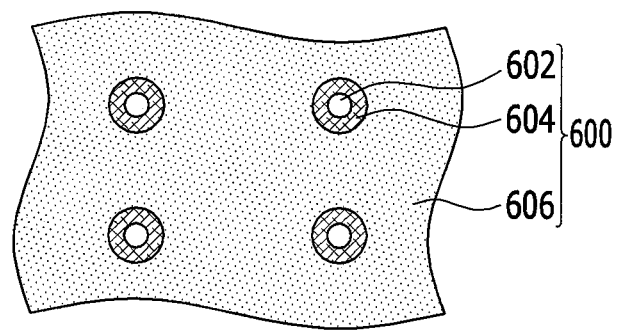
FIG. 7A is a partial cross-sectional view of a hard mask according to another exemplary embodiment.

Referring to FIG. 7A, a hard mask 600 includes an ion blocking portion 606, an ion transmission portion 602, and an ion semi-transmissive portion 604. The description related to FIG. 2 may be applied to the ion transmission portion 602 and the ion blocking portion 606. The ion semi-transmissive portion 604 is a portion where the number of ions passing therethrough is less than the number of ions passing through the ion transmission portion 602 and greater than the number of ions passing through the ion blocking portion 606. The ion semi-transmissive portion 604 is located at the periphery of the ion transmission portion 602, and the thickness thereof may be smaller than that of the ion blocking portion 606. For example, when the thickness of the ion blocking portion 606 is about 1 mm, the thickness of the ion semi-transmissive portion 604 may be about 0.5 mm. Alternatively, the ion semi-transmissive portion 604 may have a plurality of minute openings (not shown) formed by partially and minutely being eliminated. For example, when the width of the ion semi-transmissive portion 604 is 100 μm, the number of minute openings in the ion semi-transmissive portion 604 may correspond to the diameter of the ion semi-transmissive portion 604.

Figure 7B:
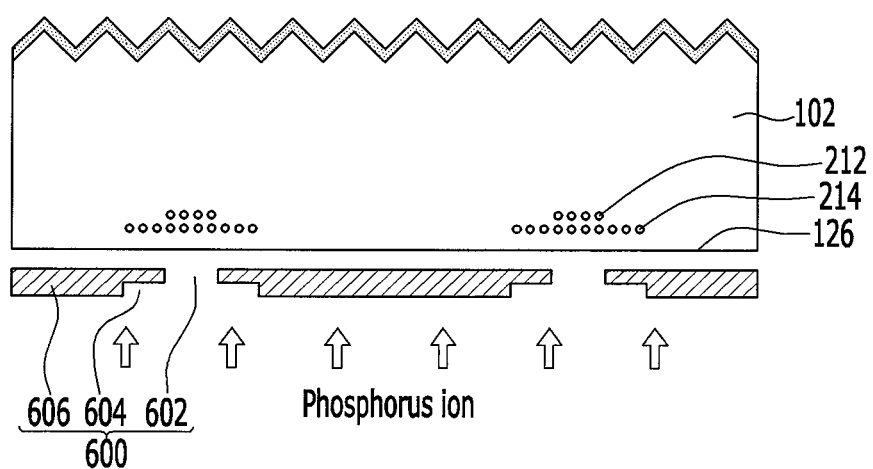
FIG. 7B to FIG. 7D are schematic cross-sectional views of processes for forming doped regions that are formed on the silicon substrate using the hard mask of FIG. 7A.

Referring to FIG. 7B, the hard mask shown in FIG. 7 is placed close to a surface 126 of the silicon substrate 102, and phosphorus ions pass through the hard mask 600 and are thus implanted in the surface 126 of the silicon substrate 102. A first n-ion implanted portion 212 to which phosphorus ions are implanted is formed in a portion of the surface 126 of the silicon substrate 102 corresponding to the ion transmission portion 602 of the hard mask 600, and a second n-ion implanted region 214 to which phosphorus ions are implanted with low concentration (e.g., low concentration compared to the concentration of the first n-ion implanted portion 212) is formed in a portion of the surface 126 of the substrate 102 corresponding to the ion semi-transmissive portion 604. The ion-implanted regions 212 and 214 correspond to the exposed surface of the substrate 102 and have a depth corresponding to the typical implantation of ions in the substrate 102, which will be easily understood by a person skilled in the art.

Figure 7C:
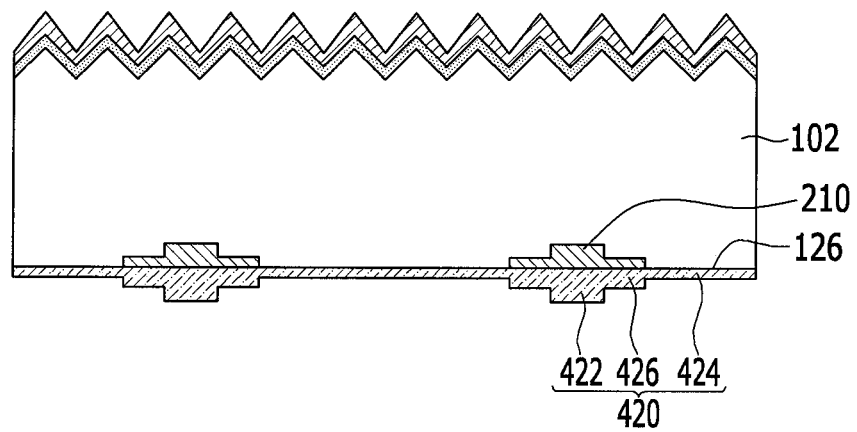

FIG. 7C is a cross-sectional view representing forming a silicon oxide layer on the silicon substrate 102 shown in FIG.

7B through the silicon oxidation process described with reference to FIG. 1D. As described above, the thickness of the back surface silicon oxide layer 420 is proportional to the ion concentration of the n-doped region 210 of the surface 126 of the silicon substrate 102, a first silicon oxide layer 422 is the thickest one, a second silicon oxide layer 424 is the thinnest one, and a third silicon oxide layer 426 is thinner then the first oxide layer 422 and thicker than the second oxide layer 424.

Figure 7D:
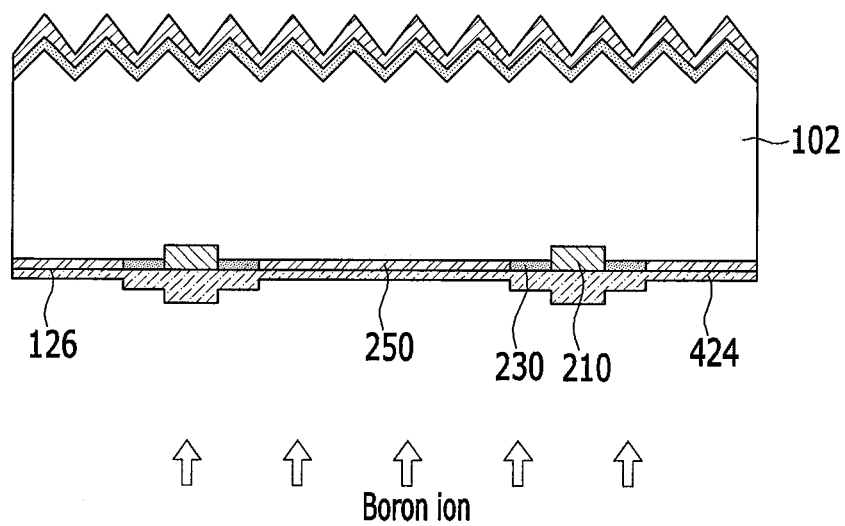

FIG. 7D is a cross-sectional view depicting the implantation of boron ions in the silicon substrate 102 of FIG. 7C as described with reference to FIG. 1E. A portion of the surface 126 of the silicon substrate 102, corresponding to a portion of the thinnest second silicon oxide layer 424 becomes a p-doped region 250. On the contrary, the second n-ion implanted region 214, that is, a region doped with a lower concentration of n-ions than that of n-ion implanted region 212, may be neutralized by a small amount of boron implanted thereto, and thus, may be a region 230 having low concentration of electrons and holes or may be a region 230 being neutralized. Thus, the n-doped region 210 and the p-doped region 250 of the silicon substrate surface 126 may be separated from each other by a width of the neutralized region 230. For example, the width of the neutralized region 230 may be about 100 μm. As described above, when the n-doped region 210 and the p-doped region 250 are separated from each other by a sufficient distance, recombination probability of electrons and holes is decreased so that efficiency of the solar cell can be improved.

Figure 8A:
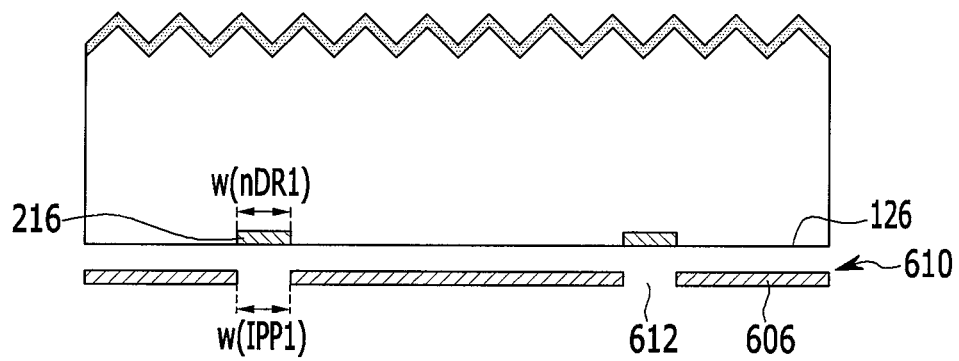
FIG. 8A to FIG. 8B are schematic cross-sectional views illustrating the forming of doped regions by implanting phosphorus ions twice according to another exemplary embodiment.
Figure 8B:
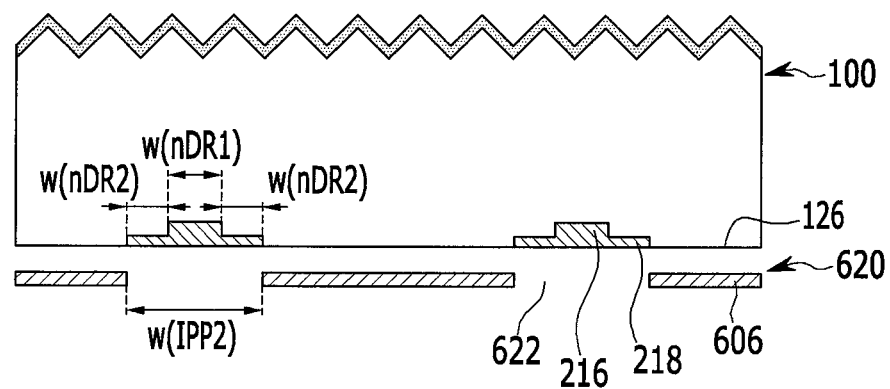

According to another exemplary embodiment, a first n-ion implanted region 212 implanted with a relatively high concentration of the above-stated ions and a second n-doped region 214 implanted with a relatively low concentration of the ions may be formed through several instances of implantation of phosphorous ions of low concentration in a surface 126 of the substrate 102, or implantation of a high concentration of phosphorus ions and implantation of a low concentration of phosphorus ions in the surface 126 of the substrate. FIG. 8A to FIG. 8B are cross-sectional views illustrating two instances of phosphorus ion implantation. A width w(IPP1) of an ion transmission portion 612 of a first hard mask 610 shown in FIG. 8A may be formed having substantially the same width as a width n(DR1) of the first n-doped region 216 implanted with a high concentration of phosphorus ions. A second hard mask 620 shown in FIG. 8B is used for a second phosphorus ion implantation process performed after the first phosphorus ion implantation shown in FIG. 8A. A width w(IPP2) of an ion transmission portion 622 of the second hard mask 620 may be equivalent to the sum of the width w(nDR1) of the first n-doped region 216 implanted with the high concentration of phosphorus ion and a width(s) w(nDR2) of a second ion implanted region 218 implanted with a low concentration of phosphorus ion.

Alternatively, the hard masks 610 and 620 used in the first and second ion phosphorus implantation processes may be used in an order opposite to the order described above. Although the order is changed, the first and second n-doped regions 216 and 218 formed in the silicon substrate 102 may be substantially equivalent to each other in shape and area.

According to another exemplary embodiment of the present invention, the regions 216 and 218 may be formed by doping a high concentration and a low concentration of phosphorus ions to the silicon substrate 102 using a photolithography with a photo resist, and this can be easily understood by a person skilled in the art.

While this disclosure has been described in connection with what is presently considered to be practical exemplary embodiments, it is to be understood that the present invention is not limited to the disclosed embodiments, but, on the contrary, is intended to cover various modifications and equivalent arrangements included within the spirit and scope of the appended claims and their equivalents.

What is claimed is:

1. A method for forming a doped region in a solar cell, the method comprising:
preparing a first surface of a substrate and a second surface of the substrate opposite the first surface;
forming a first doped region doped with a first dopant in a part of the first surface;
forming a silicon oxide layer on the first surface, the silicon oxide layer comprising:
a first silicon oxide layer on the first doped region and having a first thickness; and
a second silicon oxide layer on a portion of the first surface that was not doped by the first dopant and having a second thickness that is less than the first thickness;
implanting a second dopant from outside the first surface into the first silicon oxide layer and the second silicon oxide layer; and
forming a second doped region adjacent the first doped region by performing heat treatment on the first silicon oxide layer, the second silicon oxide layer, and the substrate.

2. The method of claim 1, wherein the forming of the first doped region comprises implanting the first dopant into the first surface and activating the implanted first dopant.

3. The method of claim 2, wherein the implanted first dopant is activated concurrently with the forming of the silicon oxide layer.

4. The method of claim 1, wherein the first thickness of the first silicon oxide layer is larger than about 1800 Å.

5. The method of claim 4, wherein the first thickness of the first silicon oxide layer is larger than about 2000 Å.

6. The method of claim 1, wherein the first doped region and the second doped region are separated from each other.

7. The method of claim 6, wherein the first doped region and the second doped region are separated from each other by more than 100 μm.

8. The method of claim 6 further comprising:
implanting the first dopant between the first doped region and the second doped region with a concentration of ions that is lower than that of the first doped region; and
implanting the second dopant between the first doped region and the second doped region with a concentration that is lower than that of the second doped region.

9. The method of claim 8, wherein the implanting of the first dopant between the first doped region and the second doped region is performed concurrently with the implanting of the first dopant to the first doped region.

10. The method of claim 8, wherein the implanting of the first dopant between the first doped region and the second doped region is performed after the implantation of the first dopant to the first doped region.

11. The method of claim 8, wherein a region between the first doped region and the second doped region comprises a neutralized region, and wherein a concentration of the first dopant in the neutralized region is higher than that of the second dopant.

12. The method of claim 8, wherein a region between the first doped region and the second doped region comprises a neutralized region, and wherein a concentration of the first dopant in the neutralized region is lower than that of the second dopant.

13. The method of claim 1, wherein the forming of the first doped region comprises:
positioning a hard mask close to the first surface of the substrate, the hard mask having at least one ion transmission portion and an ion blocking portion between ion transmission portions of the at least one ion transmission portion; and
implanting the first dopant to a portion of the first surface corresponding to the at least one ion transmission portion.

14. The method of claim 13, wherein the at least one ion transmission portion is in a shape of a closed polygon, and wherein adjacent ion transmission portions of the at least one ion transmission portion are separated.

15. The method of claim 13, wherein the hard mask further comprises an ion semi-transmission portion contacting the at least one ion transmission portion.

16. The method of claim 15, wherein the ion semi-transmission portion of the hard mask is thinner than the ion blocking portion.

17. The method of claim 15, wherein at least one micro opening having an area smaller than the at least one ion transmission portion is formed in the ion semi-transmission portion.

18. The method of claim 13, further comprising forming a neutralized region at a periphery of the first doped region, wherein the forming the neutralized region comprises:
locating the hard mask close to the first surface, the hard mask having an ion blocking portion between an ion transmission portion for forming the neutralized region and an adjacent ion transmission portion for forming the neutralized region; and
implanting the first dopant through the ion transmission portion and to the first surface,
wherein the ion transmission portion is larger than the first doped region and is located corresponding to the position of the first doped region.

19. The method of claim 18, wherein the forming of the neutralized region occurs after the forming of the first doped region.

20. The method of claim 18, wherein the forming of the neutralized region occurs before the forming of the first doped region.

21. The method of claim 1, wherein the first dopant of the first doped region is an n-type material, and wherein the second dopant of the second doped region is a p-type material.

22. The method of claim 21, further comprising performing heat treatment on the substrate after implantation of the first dopant in the substrate.

* * * * *